United States Patent [19]
Chen et al.

[11] Patent Number: 6,156,126
[45] Date of Patent: Dec. 5, 2000

[54] METHOD FOR REDUCING OR AVOIDING THE FORMATION OF A SILICON RECESS IN SDE JUNCTION REGIONS

[75] Inventors: Tung-Po Chen, Taichung; Jih-Wen Chou, Hsin-Chu, both of Taiwan

[73] Assignee: United Microelectronics Corp., Hsin-Chu, Taiwan

[21] Appl. No.: 09/484,790

[22] Filed: Jan. 18, 2000

[51] Int. Cl.⁷ ....................................................... B08B 3/04
[52] U.S. Cl. ................................. 134/2; 134/3; 134/25.4; 134/26; 134/28; 134/29; 134/34; 134/36; 134/41; 134/42; 134/902; 438/748; 438/753; 510/175
[58] Field of Search .................................... 134/2, 3, 25.4, 134/26, 28, 29, 34, 36, 41, 42, 902; 438/748, 753; 510/175

[56] References Cited

U.S. PATENT DOCUMENTS 5,358,809  10/1994  Van Berkel ................................. 430/6
6,025,274   2/2000  Lin et al. ................................. 438/721

*Primary Examiner*—Sharidan Carrillo
*Attorney, Agent, or Firm*—Harness, Dickey, & Pierce, P.L.C.

[57] ABSTRACT

A method for cleaning a silicon wafer. The method includes intentionally exposing the wafer into a volatile solvent with a polarity between about 2 and 4, whereby the wafer is cleaned by the solvent such that the formation of silicon recesses in source/drain extension regions on the silicon wafer can be prevented or avoided.

19 Claims, 1 Drawing Sheet

METHOD FOR REDUCING OR AVOIDING THE FORMATION OF A SILICON RECESS IN SDE JUNCTION REGIONS

BACKGROUND OF THE INVENTION

1. Field of the Invention

The present invention generally relates to a method for cleaning a wafer, and more particularly to a method for avoiding the formation of a silicon recess in SDE (source/drain extension)-junction regions.

2. Description of the Prior Art

Every wafer process step is a potential source of contamination, which may lead to defect formation and device failure. Cleaning of wafers must take place after each processing step and before each high-temperature operation, which make it the most frequently repeated step in IC (Integrated Circuit) manufacturing. This surface preparation includes cleaning before and after etching, oxidation, deposition, photoresist stripping, and post-CMP (Chemical Mechanical Polishing) residue removal. Wafer surfaces can have different types of contaminants, such as particles, organic residues, and inorganic residues. The goal of wafer cleaning is to remove the contaminants and to control the chemically grown ultralthin oxide on the surface.

In order to reach the cleaning standard, different cleaning processes and cleaning recipes have been exploited by many manufacturers. One conventional cleaning method that is RCA standard cleaning utilizes an APM (ammonium-peroxide mix) as cleaning solution comprising $NH_4OH$ and $H_2O_2$ at 65° C. to 80° C. This cleaning process is mainly applied after photoresist stripping.

In the deep sub-quarter micron CMOS (Complementary Metal-Oxide-Semiconductor) device, low resistance as well as an ultra-shallow junction of less than 40 nm are required. Referring to FIG. 1, a conventional semiconductor device is shown. A substrate 10 is provided with a gate oxide layer 22 and a polygate 20 formed thereon. In a typical process, SDE (Source/Drain Extension) regions are formed subsequently. Referring to the FIG. 1, an ion-implantation is performed for doping the semiconductor device, and implantation regions 12 are formed in the substrate 10.

However, silicon recesses 14 in active regions were found after HDD (Heavily Doped Drain) implanting. The thickness of recess silicon 14 is about 100–150 A, as shown in FIG. 1. This causes high resistance in SDE regions. Therefore, the performance and short channel characteristics of N channel MOS of and P channel MOS are seriously degraded by the recess of silicon.

In fact, the recess of silicon was caused by the attack of the RCA cleaning after the HDD implant. Because the silicon substrate 10 transfers to amorphous after the HDD implant and is then cleaned by APM solution in the RCA cleaning, the amorphous silicon substrate 10 is easily etched by a cleaning process, especially in the surface of the NMOS.

In order to solve the silicon recess issue in the substrate 10, one conventional method is to dilute the concentration of $NH_4OH$ in the RCA solution or to reduce the immersion duration for preventing the silicon substrate from been etched. However, the silicon recess cannot be avoided in the methods of the prior art.

SUMMARY OF THE INVENTION

In accordance with the present invention, a method is provided for avoiding the formation of silicon recesses in SDE junctions that substantially utilizes another kind of cleaning solution.

It is another object of this invention that the manipulation is accomplished simply by using the provided cleaning solution.

In one embodiment, a method for cleaning a silicon wafer after photoresist stripping is provided that includes intentionally exposing the wafer to acetone, wherein the method of exposing the wafer into the acetone comprises immersion, soaking, spraying, or a spinning spray, whereby the wafer is cleaned by the acetone solvent such that the surface of the silicon wafer can be prevented from forming a silicon recess. The present invention further comprises using a sulfuric-peroxide mixture to remove the organic contamination from the surface of the wafer, wherein the ratio of the sulfuric-peroxide mixture is between $H_2SO_4$ and $H_2O_2$ is about 2:1 to 4:1 by volume.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
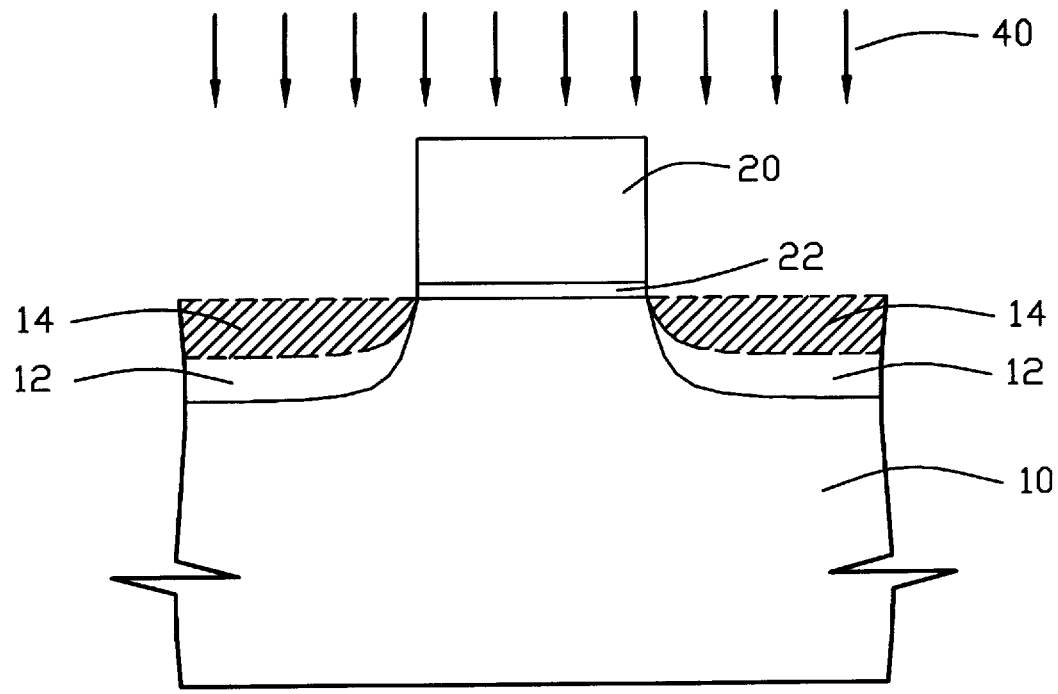
FIG. 1 is a schematic representation of a structure that shows the silicon recesses in SDE regions of a semiconductor device using conventional, prior art techniques after a RCA cleaning.

Some sample embodiments of the present invention will now be described in greater detail. Nevertheless, it should be recognized that the present invention can be practiced in a wide range of other embodiments besides those explicitly described, and the scope of the present invention is expressly not limited except as specified in the accompanying claims.

Although the embodiments illustrated herein are shown in two dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

The present invention substantially improves the cleaning solution after an HDD implant in semiconductor fabrication. The clean opportune moment is utilizing the volatile solvent having a polarity of between about 2 to 4 after photoresist stripping, in which the solvent can dissolve the polymer in the surface of a wafer. The object is to select a volatile solvent that not only will not damage the silicon substrate but also removes the polymer away from a wafer due to the volatility property. The polarity of the solvent is choosen such that the polymer can be dissolved, so the polarity is between about 2 to 4 such that the solvent will dissolve the polymer generated from photoresist stripping.

In order to increase the cleaning result, the SPM (Sulfuric-Peroxide mix) cleaning can be added after solvent cleaning. The SPM cleaning substantially removes the organic contamination. The following will set forth a preferred embodiment for wafer cleaning in accordance with the present invention.

After photoresist stripping, a wafer is put into a bath. In this embodiment, acetone is used for solvents having a polarity of 3. Because the boiling point is relatively low (about 56.5° C.), it can be volatiled and mixed with water, alcohol, or ether. However, another solvent can be used, such as ACT-NE or EKC-256(trademarks) which are acetone based solvents. In this embodiment, the acetone solution chosen to be cleaning solution has a good advantage in that it will not damage the metal in the wafer.

The cleaning method can be by immersion, soaking, spraying, or a turning spray. The immersion is to put the wafer into acetone solvent for a period of time, about 1 to 10 minutes. The soaking is to put the wafer into acetone solvent for a while, just a few seconds, and then to take the wafer away. The spraying is to spray acetone solvent onto the surface of a wafer from a jet. The turning spray is to put a wafer on a turntable base and to spray acetone solvent onto the surface of a wafer. All the above descriptions of cleaning method are performed under temperature of about 20 to 40° C.

After solvent cleaning, an optional step is SPM cleaning. The SPM cleaning can effectively remove the organic contamination out of the surface of the wafer. In this embodiment, the ratio between $H_2SO_4$ and $H_2O_2$ in SPM solution is about 2:1 to 4:1 by volume, and the preferred ratio is 3:1 by volume.

Figure 2:
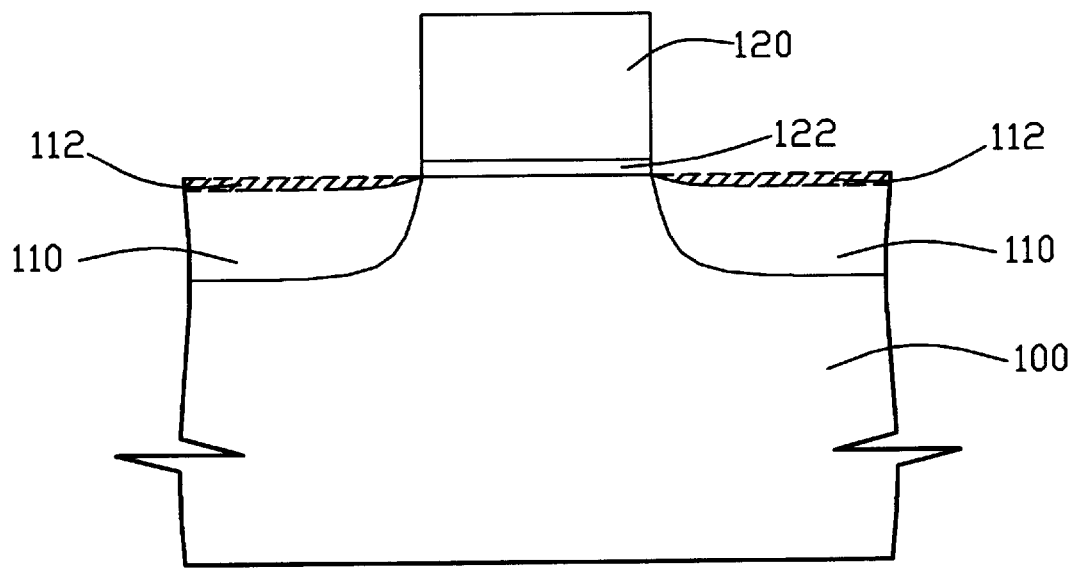
FIG. 2 is a schematic representation of a structure that shows the substrate in the SDE regions of a semiconductor device avoiding silicon recesses in accordance with a method disclosed.

Referring to FIG. 2, the structure of a semiconductor device after the cleaning process according to the present invention is shown. A substrate 100 is provided with a gate structure comprising a gate oxide layer 122 and a polygate 120 formed thereon. On the two ends of the gate structure, SDE regions 110 are formed by using ion-implanting into the substrate 100. In this embodiment, the depth of silicon recess regions 112 in the SDE regions 110 is between about 0 to 30 angstroms and lesser than the prior cleaning process. Because acetone will not damage the metal in the surface of wafer, metal can be prevented from etching using conventional APM solution in the subsequent metal gate fabrication.

In accordance with the above description, a method is provided for avoiding silicon recesses in SDE junctions that substantially utilizes another kind of cleaning solution. Moreover, the present invention provides the operation steps by using the provided cleaning solution.

Although specific embodiments have been illustrated and described, it will be obvious to those skilled in the art that various modifications may be made without departing from what is intended to be limited solely by the appended claims.

What is claimed is:

1. A method for cleaning a silicon wafer comprising the steps of:
   providing a silicon wafer;
   forming a source/drain extension region on said silicon wafer by an ion-implantation process;
   cleaning said silicon wafer by exposing said silicon wafer to a volatile solvent having a polarity of between about 2 and 4, said cleaning step resulting in a cleaned silicon wafer in which formation of a silicon recess on said source/drain extension region is prevented.

2. The method according to claim 1, wherein said volatile solvent comprises acetone.

3. The method according to claim 1, wherein exposing said silicon wafer to said volatile solvent comprises immersion, soaking, soaking, or turning spray.

4. The method according to claim 1, wherein the step of cleaning said silicon wafer occurs at a temperature between about 20 to and 40° C.

5. The method according to claim 1, wherein the step of cleaning said silicon wafer occurs after photoresist stripping of said silicon wafer.

6. The method according to claim 3, wherein the duration of immersion is between about 1 to 10 minutes.

7. A method for preventing the formation of a silicon recess in source/drain extension regions during cleaning of a silicon wafer, said method comprising the steps of:
   providing a silicon wafer having a surface, said surface including polymeric and organic contaminants;
   forming a source/drain extension region on said silicon wafer by an ion implantation process;
   removing said polymeric contaminants from said silicon wafer by contacting said silicon wafer with a volatile solvent having a polarity of between about 2 and 4, said removing step resulting in a cleaned silicon wafer in which formation of a silicon recess on said source/drain extension region is prevented; and
   exposing said silicon wafer to a sulfuric acid-hydrogen peroxide mixture to remove said organic contaminants from the surface of said silicon wafer.

8. The method according to claim 7, wherein said volatile solvent comprises acetone.

9. The method according to claim 7, wherein the ratio of sulfuric acid to hydrogen peroxide in said sulfuric acid-hydrogen peroxide mixture is about 2:1 to 4:1 by volume.

10. The method according claim 7, wherein contacting said silicon wafer with said volatile solvent comprises immersion, soaking, spraying, or turning spray.

11. The method according claims 7, wherein the step of removing said polymeric contaminants from said silicon wafer by contacting said silicon wafer with said volatile solvent occurs at a temperature between about 20 and 40° C.

12. The method according to claim 7, wherein the step of removing said polymeric contaminants from said silicon wafer occurs after photoresist stripping of said silicon wafer.

13. The method according to claim 10, wherein the duration of immersion is between about 1 to 10 minutes.

14. A method for cleaning a silicon wafer after photoresist stripping of the silicon wafer, said method comprising the steps of:
   providing a silicon wafer having a surface, said surface including polymeric and organic contaminants;
   forming a source/drain extension region on said silicon wafer by an ion-implantation process;
   removing said polymeric contaminants from said silicon wafer by contacting said silicon wafer with an acetone solvent having a polarity of between about 2 and 4, wherein contacting said silicon wafer with said acetone solvent comprises immersion, soaking, spraying, or turning spray, said removing step resulting in a cleaned silicon wafer in which formation of a silicon recess on said source/drain extension region is prevented; and
   removing said organic contaminants from said surface of said silicon wafer.

15. The method according to claim 14, further comprising using a sulfuric acid-hydrogen peroxide mixture to remove said organic contaminants from said surface of said silicon wafer.

16. The method according to claim 14, wherein the duration of immersion is between about 1 to 10 minutes.

17. The method according to claim 14, wherein the step of removing said polymeric contaminants from said silicon wafer by contacting said silicon wafer with said volatile solvent occurs at a temperature between about 20 and 40° C.

18. The method according to claim 15, wherein the ratio of sulfuric acid to hydrogen peroxide in said sulfuric acid-hydrogen peroxide mixture is about 2:1 to 4:1 by volume.

19. A method for cleaning a silicon wafer comprising the steps of:

providing a silicon wafer;

forming a source/drain extension region on said silicon wafer by an ion-implantation process;

cleaning said silicon wafer by exposing said silicon wafer to a volatile solvent having a polarity of between about 2 and 4, said cleaning step resulting in a cleaned silicon wafer having a silicon recess in the source/drain extension region, said silicon recess having a depth of 30 angstroms or less.

* * * * *